(12) United States Patent
Lin et al.

(10) Patent No.: US 7,098,522 B2
(45) Date of Patent: Aug. 29, 2006

(54) HIGH VOLTAGE DEVICE WITH ESD PROTECTION

(75) Inventors: Geeng-Lih Lin, Hsinchu Hsien (TW); Yeh-Ning Jou, Taipei (TW); Ming-Dou Ker, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 127 days.

(21) Appl. No.: 10/956,063

(22) Filed: Oct. 4, 2004

(65) Prior Publication Data
US 2005/0098795 A1 May 12, 2005

(30) Foreign Application Priority Data
Nov. 12, 2003 (TW) .............................. 92131637 A

(51) Int. Cl.
*H01L 29/00* (2006.01)
(52) U.S. Cl. ...................... 257/500; 257/355; 257/356; 257/357; 257/358; 257/359; 257/360
(58) Field of Classification Search ........ 257/355–360, 257/500
See application file for complete search history.

(56) References Cited
U.S. PATENT DOCUMENTS

| 6,459,127 | B1 | 10/2002 | Lee et al. | |
| 6,590,262 | B1 | 7/2003 | Jiang et al. | |
| 2005/0179087 | A1* | 8/2005 | Lin et al. | 257/356 |

FOREIGN PATENT DOCUMENTS
TW 493265 7/2002

\* cited by examiner

*Primary Examiner*—Fetsum Abraham
(74) *Attorney, Agent, or Firm*—Birch, Stewart, Kolasch & Birch, LLP

(57) ABSTRACT

A high voltage device. A high voltage MOS transistor is applied in the ESD protection device to the structure of which a doped region is added, generating a parasitic semiconductor controlled rectifier (SCR) having a shorter discharge path such that the SCR has faster response enhancing ESD protection.

10 Claims, 5 Drawing Sheets

HIGH VOLTAGE DEVICE WITH ESD PROTECTION

This Non-provisional application claims priority under 35 U.S.C. § 119(a) on patent application Ser. No(s). 092131637 filed in Taiwan, Republic of China on Nov. 12, 2003, the entire contents of which are hereby incorporated by reference.

BACKGROUND OF THE INVENTION

1. Field of the Invention

The present invention relates to a high voltage device with electrostatic discharge (ESD) protection and more particularly to high voltage device with a parasitic silicon controlled rectifier (SCR) which has a shorter discharge path.

2. Description of the Related Art

As semiconductor manufacturing evolves, ESD protection has become one of the most critical reliability issues for integrated circuits (IC). Several ESD test modes, such as machine mode (MM) or human body mode (HBM), have been proposed to imitate the circumstances under which an ESD event occurs. The ability to withstand certain levels of ESD is successful commercialization essential for an IC.

ESD protection circuits are generally located at input/output ports or between power rails, to release electrostatic stress before the electrostatic stress damages interior or core electronic circuits in an IC. ESD protection circuits are typically designed to be switched off during common/normal signal operation and switched on during an ESD event to release accumulated electrostatic charge.

Among ESD protection circuits, silicon controlled rectifiers (SCR) have been recognized as an effective ESD protection device. FIG. 1 shows characteristic curves of a silicon controlled rectifier (SCR). Due to the low holding voltage ($V_{hold}$, about 1V in a CMOS process) of the SCR, power (Power=$I_{ESD} \times V_{hold}$) generated by the SCR device during ESD stress is lower than other ESD protection devices (such as diode, MOS, BJT, or field-oxide device) in CMOS technologies. Therefore, the SCR device can sustain much higher ESD stress within a smaller layout area in the CMOS IC.

FIG. 2 shows a conventional high voltage device with a parasitic SCR as ESD protection device disclosed in U.S. Pat. No. 6,459,127. The high voltage device is also a N-type metal oxide semiconductor (MOS) transistor. A gate 110 of the NMOS is formed on a P substrate 100. An $N^+$ region 112 is a source of the NMOS and an N well 102 a drain of the NMOS. An $N^+$ region 106 is a contact point for the drain. The gate 110 controls the electrical connection of $N^+$ region 112 and the N well 102. The gate 110 is coupled to a ground line or a pre-driver according to circuit requirements.

The P substrate 100 is coupled to the ground line through the $P^+$ region 116. The $N^+$ region 112 is coupled to the ground line. The drain is coupled to a pad through the $N^+$ region 106. Due to low dosage concentration, the junction between the N well 102 and P substrate 100 has a very high breakdown voltage, such that high voltage signal can be input from the pad into the N well 102 and does not cause junction breakdown.

The parasitic SCR comprises a $P^+$ region 104, the N well 102, P substrate 100, and $N^+$ region 112. $P^+$ region 104 is located beside $N^+$ region 106 and beyond the gate 110. The parasitic SCR is turned on when positive ESD voltage occurs in the pad and the P substrate 100 is grounded. In FIG. 2, a discharge path A while the SCR is turned on is shown as a dotted line. The majority of the ESD current flows from the $P^+$ region 104, the N well 102, P substrate 100, and $N^+$ region 112 to the ground line releasing ESD stress.

SUMMARY OF THE INVENTION

The object of the present invention is to provide an electrostatic discharge (ESD) protection device having quick turn-on and superior ESD tolerance.

The electrostatic discharge (ESD) protection device of the present invention comprises a substrate of a first conductive type, a well of a second conductive type, a first doped region of the second conductive type, a gate, a second doped region of the second conductive type, and a third doped region of the first conductive type. The well and the first doped region are located in the substrate. The gate controls the electrical connection of the first doped region and the well. The gate, the first doped region, and the well make up a field effect transistor. The second doped region is located in the well as a contact point thereof. The third doped region is located in the well between the second doped region and the gate. The third doped region, the well, the substrate, and the first doped region make up a parasitical semiconductor controlled rectifier (SCR), and the well and the third doped region are connected to a pad.

BRIEF DESCRIPTION OF THE DRAWINGS

The present invention can be more fully understood by reading the subsequent detailed description and examples with reference made to the accompanying drawings, wherein.

DETAILED DESCRIPTION OF THE INVENTION

Figure 3:
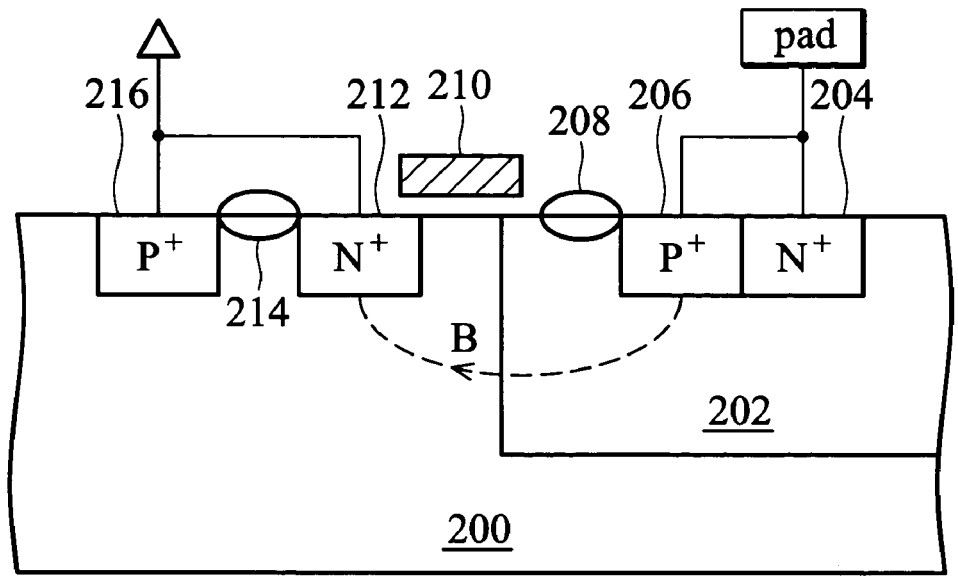
FIG. 3 is a cross-section of a high voltage NMOS device according to a first embodiment of the present invention.

FIG. 3 is a cross-section of a high voltage NMOS device according to a first embodiment of the present invention. This high voltage NMOS device in FIG. 3 acts as a switch during normal operation. The NMOS transistor comprises gate 210, $N^+$ region 212, N well 202 and P substrate 200. The $N^+$ region 212 is a source of the NMOS transistor and the N well 202 a drain, while the gate 210 controls the connection between the drain and the source. An $N^+$ region 204 formed in the N well 202 acts as an electrical contact for the N well 202. The gate 210 may be coupled to a ground line or a pre-driver according to circuit requirements.

The P substrate 200 is coupled to the ground line through a $P^+$ region 216. The drain is coupled to a pad through the $N^+$ region 204. Due to low dosage concentrations in the N well 202 and the P substrate 200, the junction between the N well 202 and the P substrate 200 has a very high breakdown voltage, making this NMOS transistor tolerant to a high voltage input signal.

A field oxide region 214 isolates the N⁺ region 212 from the P⁺ region 216. In order to avoid overstress across the gate-oxide layer under the gate 210, a field oxide region 208 is formed between a P⁺ region 206 and gate 210, lessening the induced voltage on the gate-oxide layer. The field oxide regions 208 and 214 are formed by shallow trench isolation or local oxidation of silicon.

The P⁺ region 206 is located between the N⁺ region 204 and the gate 210 and coupled to the pad. As shown in FIG. 3, the P⁺ region 206, N well 202, P substrate 200, and N⁺ region 212 make up a parasitic SCR. In FIG. 3, the P⁺ region 206 contacts the N⁺ region 204.

The pad can accommodate or accept input of a high voltage signal during normal operation. Since both doping concentrations of the P substrate 200 and the N well 202 are low, the PN junction between the P substrate 200 and N well 202 has a higher breakdown voltage. The PN junction is, therefore, strong enough to isolate the P substrate 200 and the N well 202 when no ESD event occurs in the pad. Thus, the SCR is turned off during normal operation.

The N well 202 is coupled to the pad through the N⁺ region 204 and the P substrate 200 to the ground line through the P⁺ region 216. When negative ESD voltage occurs in the pad, the PN junction is forward biased to turn on, and the pad and the ground line are short, allowing ESD stress to be released.

When positive ESD voltage from an ESD event occurs in the pad, leakage current from the N well 202 to the P substrate 200 may trigger on the SCR. FIG. 3 shows a discharge path B as a dotted line. The majority of ESD current flows through the pad, P⁺ region 206, N well 202, P substrate 200, and N⁺ region 212 to the ground line.

Figure 1:
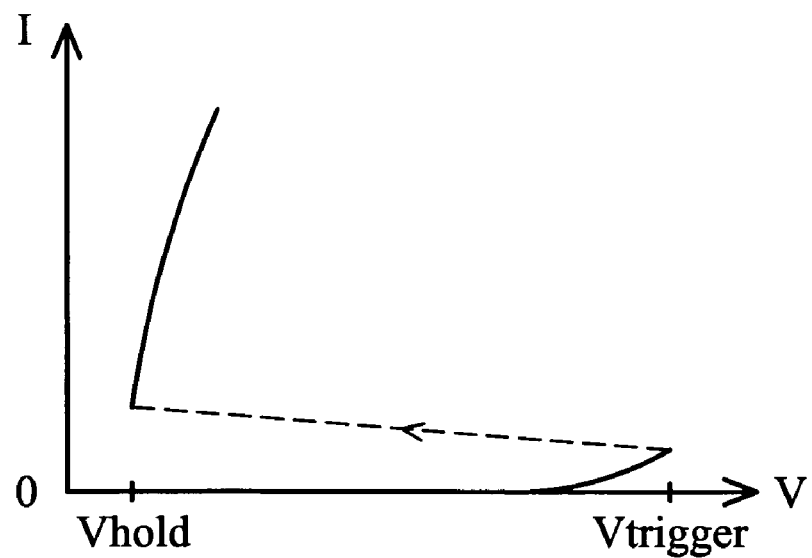
FIG. 1 shows characteristic curves of a SCR.
Figure 2:
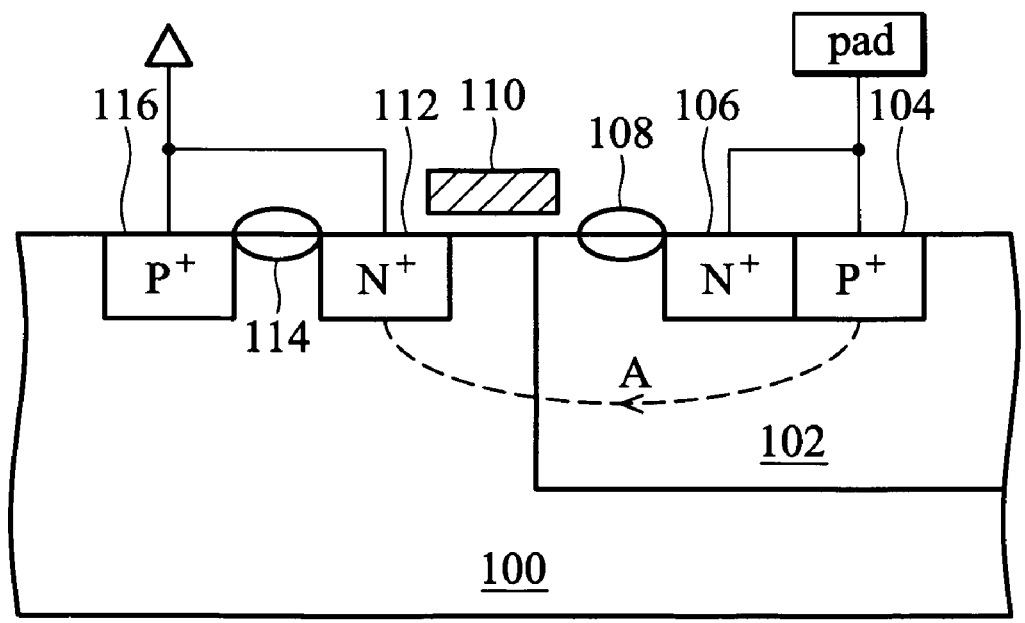
FIG. 2 shows a conventional high voltage NMOS device.

In comparison with the discharge path A in FIG. 2, the discharge path B in FIG. 3 is shorter than the discharge path A. Discharge path A flows around the N⁺ region 206 but discharge path B does not. The length of the discharge path represents the triggering time required by the SCR to release ESD stress. The shorter discharge path has the quicker triggering time. Quicker triggering time means quicker response to an ESD event and better ESD protection. In comparison with the discharge path A, the shorter discharge path B provides quicker triggering time to rapidly release ESD stress, such that internal/core circuit has better ESD protection.

Figure 4:
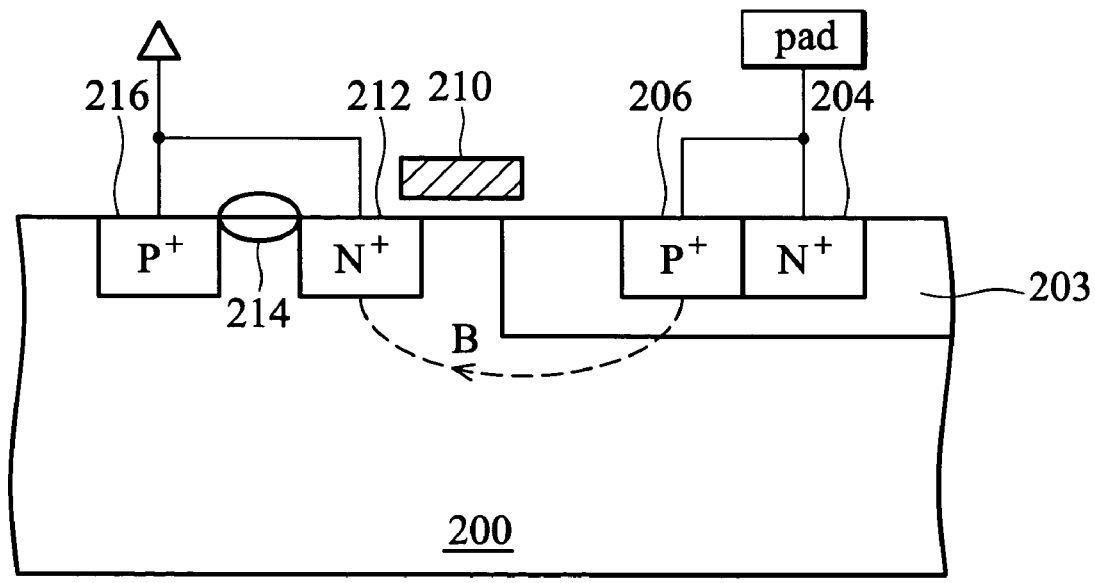
FIG. 4 is a cross-section of a high voltage NMOS device according to a second embodiment of the present invention.

FIG. 4 is a cross-section of a high voltage NMOS device according to a second embodiment of the present invention. The high voltage NMOS device is similar to that shown in FIG. 3 except that the high voltage NMOS device comprises a region 203. The field oxide regions 208 and N well 202 are replacing for the region 203. The region 203 is a NDD region. Known manufacture techniques are used to form NDD region. See U.S. Pat. No. 6,590,262.

Figure 5:
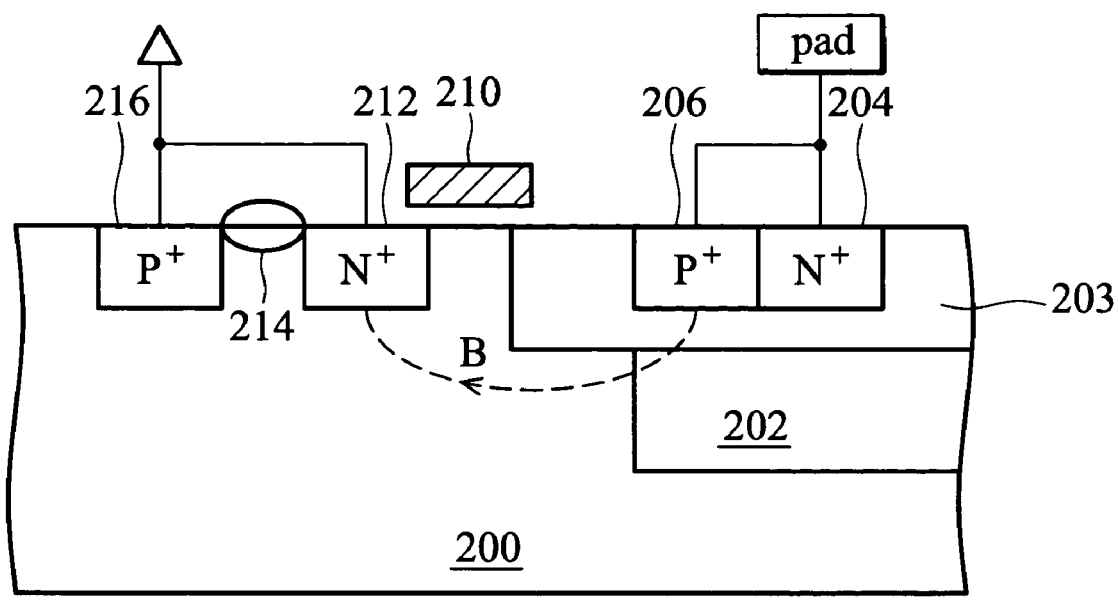
FIG. 5 is a cross-section of a high voltage NMOS device according to a third embodiment of the present invention.

FIG. 5 is a cross-section of a high voltage NMOS device according to a third embodiment of the present invention. The high voltage NMOS device is similar to that shown in FIG. 3 except that the high voltage NMOS device comprises a region 203 formed after the N well 202. The region 203 replaces for the field oxide region 208 to isolate the P⁺ region 206 from the gate 210 and is a NDD region.

Figure 6:
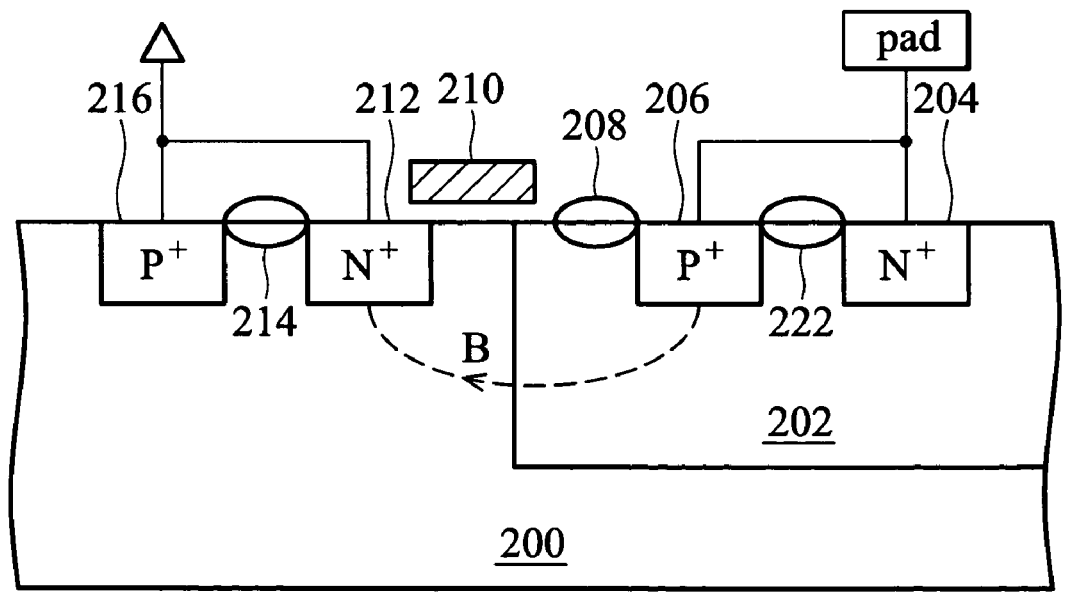
FIG. 6 is a cross-section of another high voltage NMOS device according to the present invention.
Figure 7:
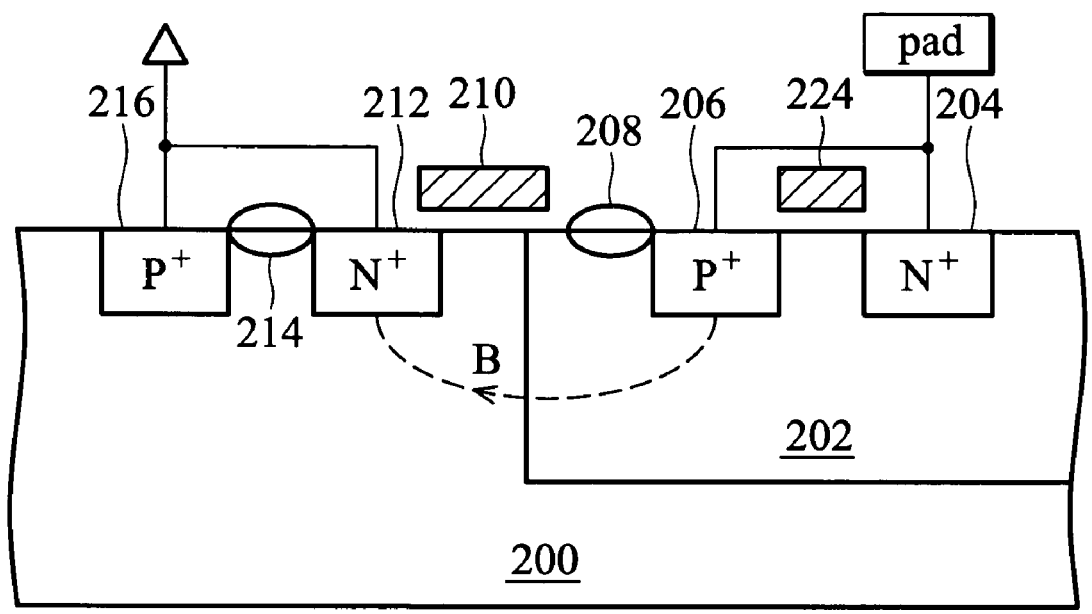
FIG. 7 is a cross-section of another high voltage NMOS device according to the present invention.

FIG. 6 is a cross-section of another high voltage NMOS device according to the present invention, in which a field oxide region 222 is formed between the P⁺ region 206 and the N⁺ region 204. FIG. 7 is a cross-section of another high voltage NMOS device according to the present invention, in which a dummy gate 224 on the N well 220 separates the P⁺ region 206 from the N⁺ region 204. The dummy gate 224 can be a floating gate and receives no signal. The dummy gate 224 can alternatively be connected to the pad.

Figure 8:
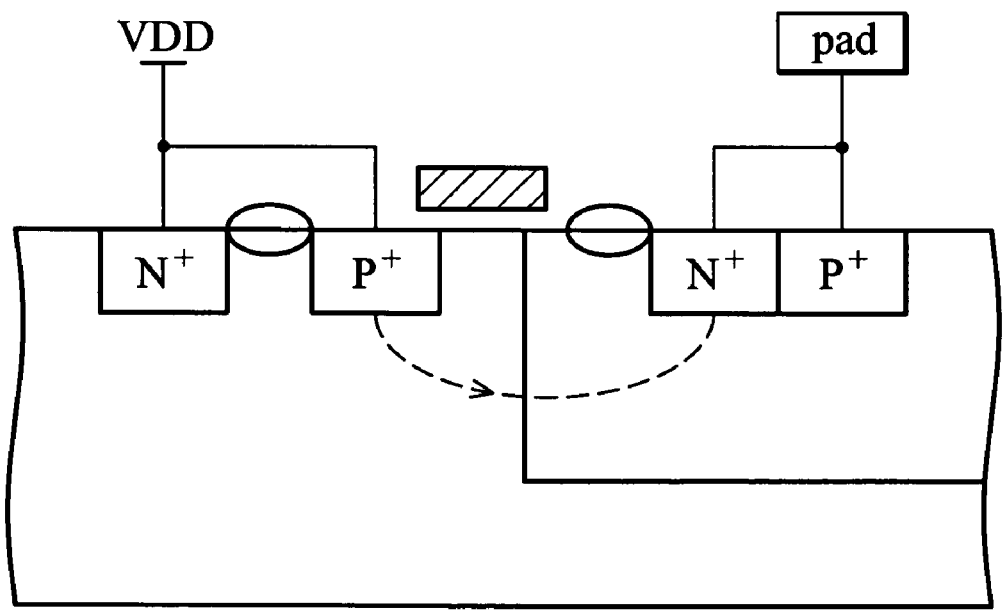
FIGS. 8 to 10 show three cross-sections of high voltage P-type transistors of the present invention, respectively corresponding to FIGS. 3, 6, and 7.
Figure 9:
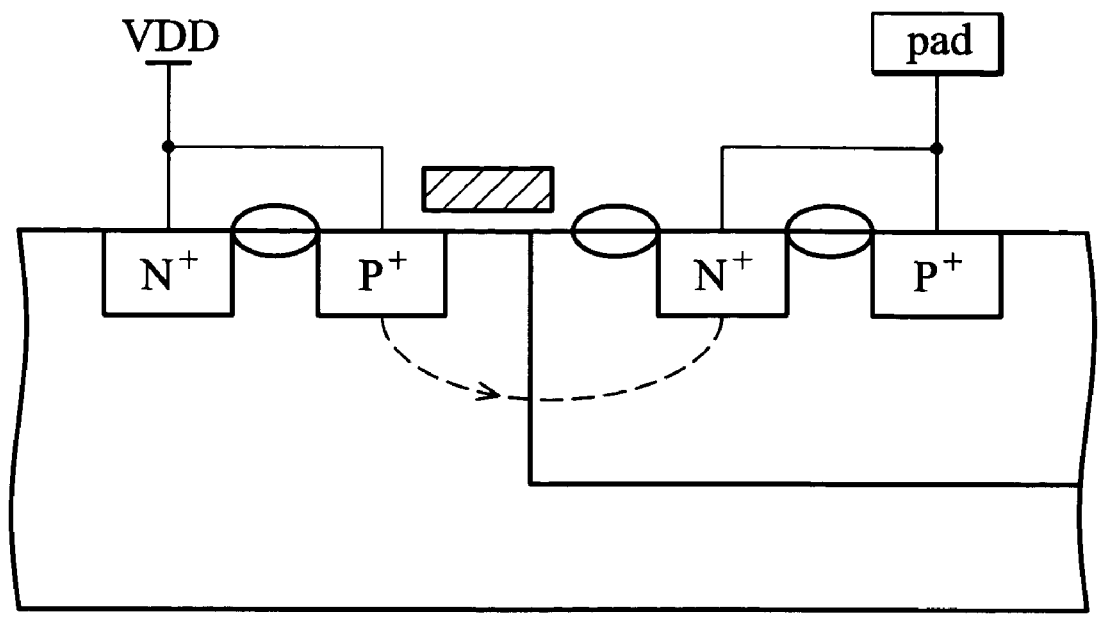
Figure 10:
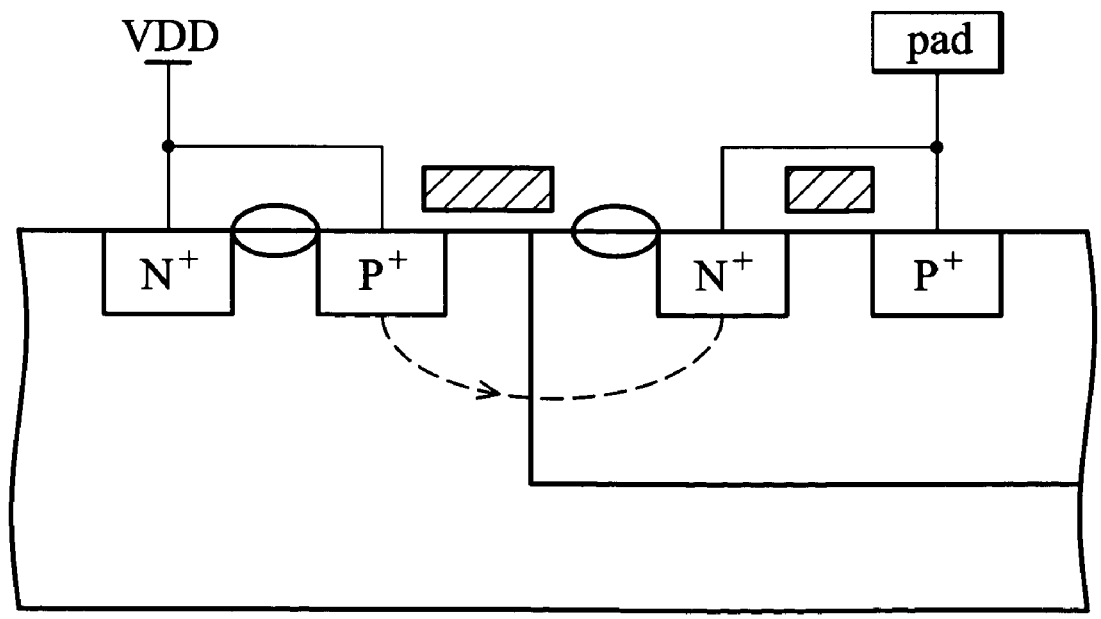

Conversion between P-type and N-type components is well known to those skilled in the art. The present invention can also be applied in PMOS transistors. FIGS. 8 to 10 show three cross-sections of high voltage P-type transistors of the present invention, respectively corresponding to FIGS. 3, 6, and 7. Each ground line in FIGS. 3 to 5 is a power line VDD in FIGS. 8 to 10 and each NMOS transistor in FIGS. 3, 6, and 7 is a PMOS transistor in FIGS. 8 to 10.

The provided structure of the present invention not only generates a parasitic SCR but also supplies a shorter discharge path for faster release of ESD stress, providing increased ESD tolerance in IC products.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high voltage device with electrostatic discharge (ESD) protection, comprising:
   a substrate of a first conductive type;
   a well of a second conductive type in the substrate;
   a first doped region of the second conductive type in the substrate;
   a gate controlling the electrical connection of the first doped region and the well, wherein the gate, the first doped region, and the well make up a field effect transistor;
   a second doped region of the second conductive type in the well as a contact point thereof; and
   a third doped region of the first conductive type in the well between the second doped region and the gate, wherein the third doped region, the well, the substrate, and the first doped region constitute a parasitic semiconductor controlled rectifier (SCR), and the well and the third doped region are connected to a pad.

2. The high voltage device as claimed in claim 1, further comprising a fourth doped region of the first conductive type in the substrate acting as a contact point thereof.

3. The high voltage device as claimed in claim 2, wherein the first conductive type is P-type and the second conductive type is N-type.

4. The high voltage device as claimed in claim 2, further comprising a field oxide region between the fourth doped region and the first doped region.

5. The high voltage device as claimed in claim 3, wherein the first doped region and the fourth doped region are connected to a ground line.

6. The high voltage device as claimed in claim 1, wherein the first conductive type is N-type and the second conductive type P-type.

7. The high voltage device as claimed in claim 6, wherein the first doped region and the fourth doped region are connected to a power line.

8. The high voltage device as claimed in claim 1, further comprising a NDD region, isolated the gate from the third doped region.

9. The high voltage device as claimed in claim 1, further comprising a dummy gate between the third doped region and the second doped region.

10. The high voltage device as claimed in claim 1, wherein the third doped region contacts the second doped region.

* * * * *